United States Patent
Fan et al.

(10) Patent No.: US 9,584,128 B2
(45) Date of Patent: Feb. 28, 2017

(54) STRUCTURE OF MULTI-MODE SUPPORTED AND CONFIGURABLE SIX-INPUT LUT, AND FPGA DEVICE

(71) Applicant: CAPITAL MICROELECTRONICS CO., LTD., Beijing (CN)

(72) Inventors: Ping Fan, Beijing (CN); Jia Geng, Beijing (CN); Yuanpeng Wang, Beijing (CN)

(73) Assignee: Capital Microelectronics Co., Ltd., Beijing (CN)

( * ) Notice: Subject to any disclaimer, the term of this patent is extended or adjusted under 35 U.S.C. 154(b) by 28 days.

(21) Appl. No.: 14/761,410

(22) PCT Filed: Dec. 11, 2014

(86) PCT No.: PCT/CN2014/093567
§ 371 (c)(1),
(2) Date: Jul. 16, 2015

(87) PCT Pub. No.: WO2016/090597
PCT Pub. Date: Jun. 16, 2016

(65) Prior Publication Data
US 2016/0315619 A1    Oct. 27, 2016

(51) Int. Cl.
*H03K 19/173* (2006.01)
*H03K 19/177* (2006.01)
*H03K 19/00* (2006.01)

(52) U.S. Cl.
CPC ... *H03K 19/17728* (2013.01); *H03K 19/0008* (2013.01); *H03K 19/1732* (2013.01); *H03K 19/1737* (2013.01); *H03K 19/17776* (2013.01)

(58) Field of Classification Search
CPC ....... H03K 19/17728; H03K 19/17736; H03K 19/17748; H03K 19/17776
USPC ................................................ 326/37–41, 47
See application file for complete search history.

(56) References Cited

U.S. PATENT DOCUMENTS

| | | | | |
|---|---|---|---|---|
| 7,385,416 | B1 * | 6/2008 | Chirania | H03K 19/17728 326/37 |
| 7,394,287 | B1 * | 7/2008 | Hutton | H03K 19/17728 326/38 |
| 2001/0045844 | A1 * | 11/2001 | New | H03K 19/17728 326/38 |

(Continued)

*Primary Examiner* — Jason M Crawford
(74) *Attorney, Agent, or Firm* — Buchanan Ingersoll & Rooney PC

(57) ABSTRACT

A structure of a multi-mode supported and configurable six-input look-up table (LUT), and a field-programmable gate array (FPGA) device. The six-input LUT has six signal input ends and two signal output ends. The six-input LUT includes: a first five-input LUT, a second five-input LUT, a first multiplexer, and a second multiplexer. The first five-input LUT outputs a first output signal according to five data signals input by five signal input ends of the six-input LUT, where the first output signal is output by a first signal output end of the six-input LUT; the second five-input LUT outputs a second output signal according to the five data signals input by the five signal input ends of the six-input LUT; and the first multiplexer outputs a control signal according to a set configuration mode, to control the second multiplexer to output the first output signal or the second output signal.

14 Claims, 2 Drawing Sheets

(56) References Cited

U.S. PATENT DOCUMENTS

2013/0278289 A1\* 10/2013 Jang ................ H03K 19/17728
326/38
2016/0246571 A1\* 8/2016 Walters, III ............. G06F 7/575

\* cited by examiner

STRUCTURE OF MULTI-MODE SUPPORTED AND CONFIGURABLE SIX-INPUT LUT, AND FPGA DEVICE

BACKGROUND

Technical Field

The present invention relates to the field of integrated circuit technologies, and in particular, to a structure of a multi-mode supported and configurable six-input look-up table (LUT), and a field-programmable gate array (FPGA) device.

Related Art

A field-programmable gate array (Field-Programmable Gate Array, FPGA) is a logical device having rich hardware resources, powerful parallel processing capabilities, and flexible reconfigurability. The FPGA has been widely applied in many fields such as data processing, communications, and networks due to these features.

A look-up table (Look-up table, LUT) is a main element of a modern FPGA device and the LUT is substantially a random-access memory (Random-Access Memory, RAM). At present, most FPGAs use 4-input LUTs and each LUT may be regarded as a 16x1 RAM with a 4-bit address line. After a user describes a logic circuit by using a conceptual diagram or an HDL language, FPGA development software computes all possible results of the logic circuit automatically and writes the results into an RAM. In this case, each time inputting a signal to perform a logic operation is equivalent to inputting an address to look up a table, content corresponding to the address is searched for, and then the content is output.

As an application system is enhanced in functions and is increased in scale, the required number of gate arrays of a programmable logical device increases day by day, for example, a wide range of applications of FPGAs with thousands of gate levels. The increase in the number of the gates of the FPGA brings a strengthened function implementation capabilities and enhanced functions, but incurs performance degradation of the FPGA correspondingly, such as an increase in chip area, an increase in power consumption, and speed reduction, which all restrict the performance of the entire system. Therefore, it not only requires a reduction in process dimensions and an increase in the number of gate arrays, but also requires improvement of application capabilities of all logical blocks.

Improvement of flexibility, logic implementation capabilities and computing capabilities of the LUT may effectively improve the utilization of cabling resources, reduce the area occupied by resources, and further improve the operating speed of a chip, thereby implementing more functions and applications by using limited resources.

SUMMARY

In view of the defects of the prior art, an objective of the present invention is to provide a structure of a multi-mode supported and configurable six-input LUT and an FPGA device. The structure of the six-input LUT has higher flexibility, logic implementation capabilities and computing capabilities, which can effectively improve the utilization of cabling resources, reduce the area occupied by resources, and further improve the operating speed of an FPGA chip, thereby implementing more functions and applications by using limited resources.

According to a first aspect, an embodiment of the present invention provides a structure of a multi-mode supported and configurable six-input LUT, where the six-input LUT has six signal input ends and two signal output ends; and the structure of the six-input LUT includes:

a first five-input LUT, a second five-input LUT, a first multiplexer, and a second multiplexer, where the first five-input LUT receives five data signals input by five signal input ends of the six-input LUT, and outputs a first output signal according to the five data signals, where the first output signal is output by a first signal output end of the six-input LUT;

the second five-input LUT receives five data signals input by the five signal input ends of the six-input LUT and outputs a second output signal according to the five data signals; and the first multiplexer outputs a control signal according to a set configuration mode, to control the second multiplexer to output the first output signal or the second output signal in a multiplexed manner, where the first output signal or the second output signal that is output by the second multiplexer in a multiplexed manner is output by a second signal output end of the six-input LUT.

Preferably, the first multiplexer is specifically an alternative multiplexer, including a first input end, a second input end, and an output end; and the first input end of the first multiplexer accesses a sixth data signal input by one remaining signal input end other than the five signal input ends, the second input end accesses a preset constant, and the output end of the first multiplexer is connected to a multiplexing signal input end of the second multiplexer.

Further, preferably, when the first multiplexer outputs the preset constant according to the configuration mode, the second multiplexer outputs the second output signal in a multiplexed manner according to the preset constant, where the second output signal is output by the second signal output end of the six-input LUT, so that the structure of the six-input LUT implements logical functions of two five-input LUTs.

Further, preferably, when the first multiplexer outputs the preset constant in a multiplexed manner, the one remaining signal input end of the six-input LUT other than the five signal input ends is further used for inputting an addend to an adder connected to the six-input LUT.

Further, preferably, the preset constant is 0.

Further, preferably, when the first multiplexer outputs the sixth data signal according to the configuration mode, the second multiplexer outputs the first output signal or the second output signal in a multiplexed manner according to the sixth data signal, where the first output signal or the second output signal is output by the second signal output end of the six-input LUT, so that the structure of the six-input LUT implements a logical function of a six-input LUT.

According to a second aspect, an embodiment of the present invention provides an FPGA device, where the FPGA device includes the structure of the multi-mode supported and configurable six-input LUT according to the foregoing first aspect.

The structure of the multi-mode supported and configurable six-input LUT provided by this embodiment of the present invention can implement a logical function of one six-input LUT or implement logical functions of two five-input LUTs, and therefore has higher flexibility, logic implementation capabilities and computing capabilities, which can effectively improve the utilization of cabling resources, reduce the area occupied by resources, and further improve the operating speed of an FPGA chip, thereby implementing more functions and applications by using limited resources.

The technical solutions of the present invention are further described in detail in the following with reference to accompanying drawings and embodiments.

DETAILED DESCRIPTION

To make the objectives, technical solutions and advantages of the present invention more clear, the present invention is described in detail in the following with reference to accompanying drawings. Obviously, the described embodiments are merely some but not all of the embodiments of the present invention. All other embodiments obtained by a person of ordinary skill in the art based on the embodiments of the present invention without creative efforts shall fall within the protection scope of the present invention.

Figure 1:
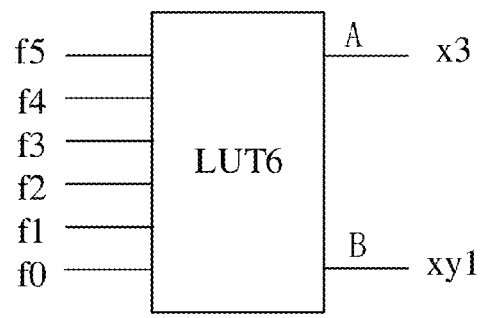
FIG. 1 is a schematic diagram of input and output ports of a structure of a six-input LUT according to an embodiment of the present invention.

FIG. 1 is a schematic diagram of input and output ports of a structure of a multi-mode supported and configurable six-input LUT according to an embodiment of the present invention. As shown in FIG. 1, the six-input LUT of the present invention is used inside an FPGA, including: six signal input ends f0 to f5 and two signal output ends A and B.

Ports may be specifically described in Table 1 below.

TABLE 1

| Port | Bit width | Input/output | Function description |
| --- | --- | --- | --- |
| f0 | 1 | I | Data input |
| f1 | 1 | I | Data input |
| f2 | 1 | I | Data input |
| f3 | 1 | I | Data input |
| f4 | 1 | I | Data input |
| f5 | 1 | I | Data input |
| A | 1 | O | Data output of a first LUT5 |
| B | 1 | O | Data output of an LUT 6 or a second LUT5 |

When the FPGA is electrified, the six-input LUT may be configured to either of the following two modes: a six-input LUT mode or a mode with two five-input LUTs.

Figure 2:
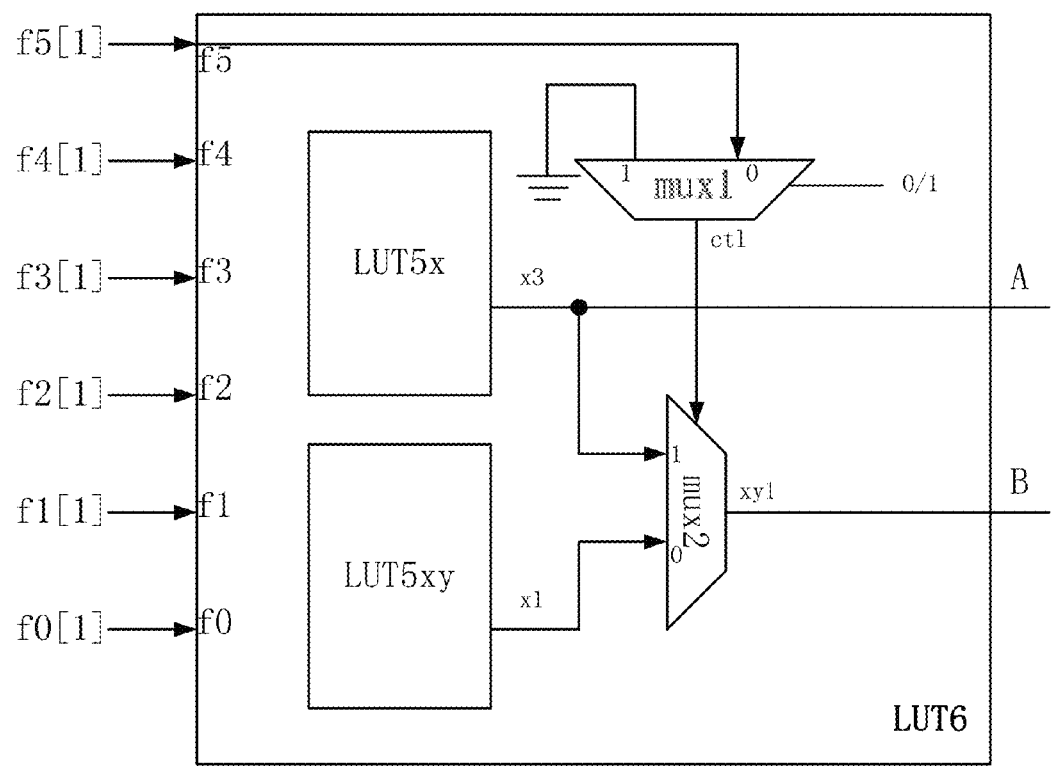
FIG. 2 is a schematic diagram of a structure of a six-input LUT according to an embodiment of the present invention.

Specifically, a logical structure inside the six-input LUT may be shown in FIG. 2, which includes two five-input LUTs: LUT5x and LUT5xy, and two multiplexers: mux1 and mux2.

LUT5x receives f0[1] to f4[1] input by five signal input ends of the six-input LUT, and outputs a first output signal x3 according to f0[1] to f4[1], where the first output signal x3 is output by a first signal output end A of the six-input LUT.

LUT5xy receives f0[1] to f4[1] input by the five signal input ends of the six-input LUT and outputs a second output signal x1 according to the five data signals.

Mux1 outputs a control signal ct1 according to a set configuration mode, to control mux2 to output the first output signal x3 or the second output signal x1 in a multiplexed manner, where the first output signal x3 or the second output signal x1 is output by a second signal output end B of the six-input LUT.

Further, specifically, mux1 is an alternative multiplexer, including two input ends and one output end.

When the six-input LUT is configured to the mode with two five-input LUTs:

ct1 output by mux1 according to the configuration mode is a preset constant, and in the schematic diagram of the structure of the six-input LUT shown in this embodiment, the preset constant is a digital signal low level 0. Mux2 outputs the second output signal x1, output by LUT5xy, in a multiplexed manner according to the digital signal low level, where the second output signal x1 is output by the second signal output end B of the six-input LUT.

The first output signal x3 output by LUT5x is output by the first signal output end A of the six-input LUT, and therefore, in such a configuration mode, the structure of the six-input LUT implements logical functions of two independent five-input LUTs.

Figure 3:
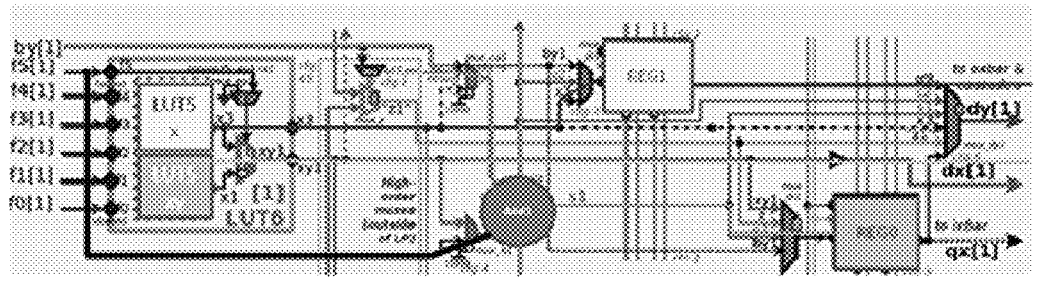
FIG. 3 is a schematic diagram of a logic cell (LC) of an FPGA according to an embodiment of the present invention.

In this case, the signal input end f5 of the six-input LUT is idle and is not occupied by logic of the two five-input LUTs, and therefore, the signal input end f5 may further be used for inputting an addend to an adder, connected to the six-input LUT, in a logic cell (Logic cell, LC) of an FPGA shown in FIG. 3. Specifically, reference may be made to a signal transmission path shown by bold lines in FIG. 3. In this way, a resource of one signal input port can be saved and the utilization of cabling resources can be improved.

When the six-input LUT is configured to the six-input LUT mode:

referring to FIG. 2 again, ct1 output by mux1 according to the configuration mode is f5[1], and mux2 outputs the first output signal x3 or the second output signal x1 in a multiplexed manner according to f5[1], where the first output signal x3 or the second output signal x1 is output by the second signal output end B of the six-input LUT.

Specific logic thereof may be preset. For example, it is specified that, when f5[1]=0, the second signal output end B outputs the first output signal x3, and when f5[1]=1, the second signal output end B outputs the second output signal x1; or when f5[1]=0, the second signal output end B outputs the second output signal x1, and when f5[1]=1, the second signal output end B outputs the first output signal x3. In this way, the structure of the six-input LUT provided by this embodiment implements a logical function of a six-input LUT.

The structure of the multi-mode supported and configurable six-input LUT provided by this embodiment of the present invention can implement a logical function of one six-input LUT or implement logical functions of two five-input LUTs, and therefore has higher flexibility, logic implementation capabilities and computing capabilities, which can effectively improve the utilization of cabling resources, reduce the area occupied by resources, and further improve the operating speed of an FPGA chip, thereby implementing more functions and applications by using limited resources.

Figure 4:
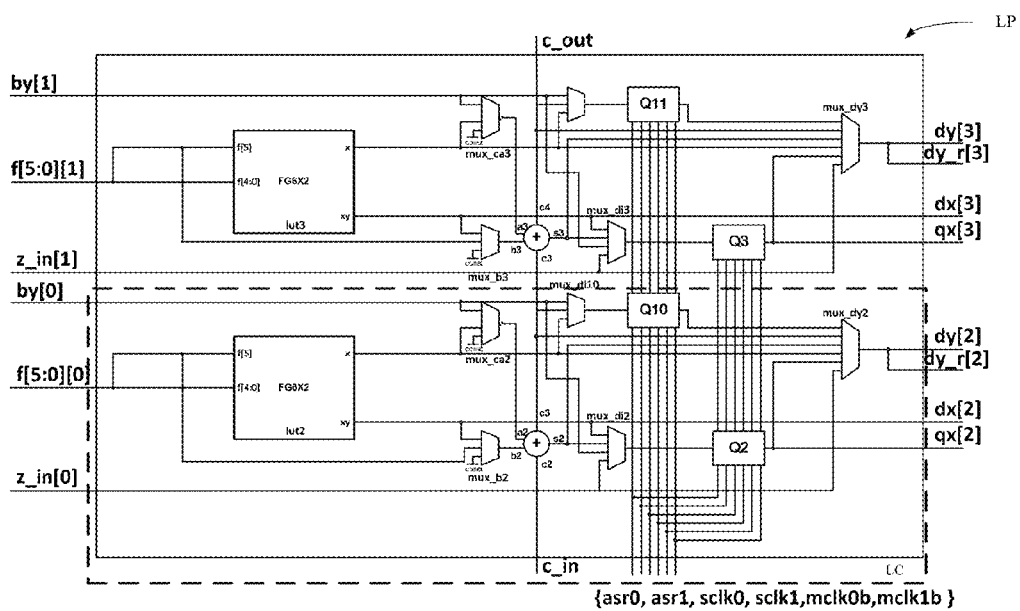
FIG. 4 is a schematic diagram of a logic parcel (LP) of an FPGA according to an embodiment of the present invention.

Correspondingly, an embodiment of the present invention further provides an FPGA device including the structure of the multi-mode supported and configurable six-input LUT described in the foregoing embodiment. The FPGA device described by the present invention includes multiple logic elements (Logic Element, LE), where each LE includes 4 Logic Parcels (LPs) shown in FIG. 4, each LP includes two LCs shown in FIG. 3, and each LC shown in FIG. 4 includes a multi-mode supported and configurable six-input LUT FG6X2, a full adder, and two registers (Q2 and Q10, or Q3 and Q11 shown in FIG. 4). The six-input LUT FG6X2 can implement a logical function of one six-input LUT or implement logical functions of two five-input LUTs.

Persons skilled in the art may further realize that, in combination with the embodiments herein, units and algorithm, steps of each example described can be implemented with electronic hardware, computer software, or the combination thereof. In order to clearly describe the interchangeability between the hardware and the software, compositions and steps of each example have been generally described according to functions in the foregoing descriptions. Whether the functions are executed in a mode of hardware or software depends on particular applications and design constraint conditions of the technical solutions. Persons skilled in the art can use different methods to implement the described functions for each particular application, but it should not be considered that the implementation goes beyond the scope of the embodiments of the present invention.

In combination with the embodiments herein, steps of the method or algorithm described may be directly implemented using hardware, a software module executed by a processor, or the combination thereof. The software module may be placed in a random access memory (RAM), a memory, a read-only memory (ROM), an electrically programmable ROM (EPROM), an electrically erasable programmable ROM (EEPROM), a register, a hard disk, a removable magnetic disk, a CD-ROM, or any storage medium of other forms well-known in the technical field.

The objectives, technical solutions, and beneficial effects of the present invention have been described in further detail through the above specific embodiments. It should be understood that the above descriptions are merely specific embodiments of the present invention, but not intended to limit the present invention. Any modification, equivalent replacement, or improvement made without departing from the spirit and principle of the present invention should fall within the scope of the present invention.

What is claimed is:

1. A structure of a multi-mode supported and configurable six-input look-up table (LUT), wherein the six-input LUT has six signal input ends and two signal output ends; and
the structure of the six-input LUT comprises:
a first five-input LUT, a second five-input LUT, a first multiplexer and a second multiplexer, wherein
the first five-input LUT receives five data signals input by five signal input ends of the six-input LUT, and outputs a first output signal according to the five data signals, wherein the first output signal is output by a first signal output end of the six-input LUT;
the second five-input LUT receives five data signals input by the five signal input ends of the six-input LUT and outputs a second output signal according to the five data signals; and
the first multiplexer outputs a control signal according to a set configuration mode, to control the second multiplexer to output the first output signal or the second output signal in a multiplexed manner, wherein the first output signal or the second output signal that is output by the second multiplexer in a multiplexed manner is output by a second signal output end of the six-input LUT.

2. The structure according to claim 1, wherein the first multiplexer is specifically an alternative multiplexer, comprising a first input end, a second input end and an output end; and
the first input end of the first multiplexer accesses a sixth data signal input by one remaining signal input end other than the five signal input ends, the second input end accesses a preset constant, and the output end of the first multiplexer is connected to a multiplexing signal input end of the second multiplexer.

3. The structure according to claim 2, wherein when the first multiplexer outputs the preset constant according to the configuration mode, the second multiplexer outputs the second output signal in a multiplexed manner according to the preset constant, wherein the second output signal is output by the second signal output end of the six-input LUT, so that the structure of the six-input LUT implements logical functions of two five-input LUTs.

4. The structure according to claim 3, wherein when the first multiplexer outputs the preset constant in a multiplexed manner, the one remaining signal input end of the six-input LUT other than the five signal input ends is further used for inputting an addend to an adder connected to the six-input LUT.

5. The structure according to claim 2, wherein the preset constant is 0.

6. The structure according to claim 2, wherein when the first multiplexer outputs the sixth data signal according to the configuration mode, the second multiplexer outputs the first output signal or the second output signal in a multiplexed manner according to the sixth data signal, wherein the first output signal or the second output signal is output by the second signal output end of the six-input LUT, so that the structure of the six-input LUT implements a logical function of a six-input LUT.

7. A field-programmable gate array (FPGA) device, comprising the structure of the multi-mode supported and configurable six-input look-up table (LUT) according to claim 1.

8. The structure according to claim 3, wherein the preset constant is 0.

9. A field-programmable gate array (FPGA) device, comprising the structure of the multi-mode supported and configurable six-input look-up table (LUT) according to claim 2.

10. A field-programmable gate array (FPGA) device, comprising the structure of the multi-mode supported and configurable six-input look-up table (LUT) according to claim 3.

11. A field-programmable gate array (FPGA) device, comprising the structure of the multi-mode supported and configurable six-input look-up table (LUT) according to claim 4.

12. A field-programmable gate array (FPGA) device, comprising the structure of the multi-mode supported and configurable six-input look-up table (LUT) according to claim 5.

13. A field-programmable gate array (FPGA) device, comprising the structure of the multi-mode supported and configurable six-input look-up table (LUT) according to claim 6.

14. A field-programmable gate array (FPGA) device, comprising the structure of the multi-mode supported and configurable six-input look-up table (LUT) according to claim 8.

* * * * *